US006576936B1

(12) United States Patent
Bauer et al.

(10) Patent No.: US 6,576,936 B1
(45) Date of Patent: Jun. 10, 2003

(54) BIPOLAR TRANSISTOR WITH AN INSULATED GATE ELECTRODE

(75) Inventors: Friedhelm Bauer, Semione (CH); Hans-Rudolf Zeller, Birr (CH)

(73) Assignee: ABB (Schweiz) AG, Baden (CH)

( * ) Notice: Subject to any disclaimer, the term of this patent is extended or adjusted under 35 U.S.C. 154(b) by 0 days.

(21) Appl. No.: 09/622,839

(22) PCT Filed: Feb. 25, 1999

(86) PCT No.: PCT/CH99/00086

§ 371 (c)(1),
(2), (4) Date: Oct. 10, 2000

(87) PCT Pub. No.: WO99/44240

PCT Pub. Date: Sep. 2, 1999

(30) Foreign Application Priority Data

Feb. 27, 1998 (DE) .......................... 198 08 154
May 23, 1998 (DE) .......................... 198 23 170

(51) Int. Cl.[7] .............................. H01L 29/423
(52) U.S. Cl. ............... 257/133; 257/139; 257/327; 257/328; 257/401
(58) Field of Search ............... 257/327, 133, 257/328, 489, 401, 341, 332, 335, 134, 139

(56) References Cited

U.S. PATENT DOCUMENTS

| 4,644,637 | A | 2/1987 | Temple |
| 4,783,690 | A | 11/1988 | Walden et al. |
| 5,208,471 | A | 5/1993 | Mori et al. |
| 5,464,992 | A | 11/1995 | Okabe et al. |
| 5,525,816 | A | 6/1996 | Takahashi |
| 5,528,058 | A | 6/1996 | Pike, Jr. et al. |
| 5,539,232 | A | 7/1996 | Nakanishi et al. |
| 5,585,651 | A | 12/1996 | Kitagawa et al. |
| 5,661,315 | A | 8/1997 | Bauer et al. |
| 5,665,996 | A | 9/1997 | Williams et al. |
| 6,268,628 | B1 * | 7/2001 | Yoshida ............... 257/341 |

FOREIGN PATENT DOCUMENTS

| DE | 3519389 C2 | 12/1985 |
| DE | 4301947 A1 | 8/1993 |
| DE | 4324481 A1 | 1/1994 |

(List continued on next page.)

OTHER PUBLICATIONS

German Search Report dated Nov. 18, 1998.

German Search Report dated Jul. 31, 1998.

*MCT Kontra IGBT MOS–gesteuerter leistungsschalter über 2000 V\* Teil 1*, Bauer, F., Stockmeier, T., elektrotechnik—heft 7/8–Aug. 31, 1994, pp. 26–30.

*IGBT–hochsperrende, Schnell Schaltende Transistormodule*, Vogel, D., Elektronik 9, 1987, pp. 120–124.

*Cell Geometry Effect On IGT Latch–Up*, Yilmaz, H., IEEE Electron Device Letters, vol. EDL–6, 1985, pp. 419–421.

*The BETA–MOSFET: A Novel High Performance Transistor*, Yoh, Kanji, et al., Electronics and Communications in Japan, Part 2, vol. 79, No. 12, 1996, pp. 47–53.

(List continued on next page.)

*Primary Examiner*—Wael Fahmy
*Assistant Examiner*—Nathan W. Ha
(74) *Attorney, Agent, or Firm*—Burns, Doane, Swecker & Mathis, L.L.P.

(57) ABSTRACT

An IGBT is specified which can be produced in a simple manner yet can be turned on homogeneously. For this purpose, gate fingers are dispensed with and the gate current in the IGBT-Chip is forwarded, proceeding from the gate terminal, directly via the polysilicon layers of the gate electrodes to the IGBT standard cells.

10 Claims, 4 Drawing Sheets

FOREIGN PATENT DOCUMENTS

| | | | |
|---|---|---|---|
| DE | 4344278 | A1 | 6/1994 |
| DE | 4315178 | A1 | 11/1994 |
| DE | 19506386 | A1 | 8/1995 |
| DE | 19530109 | A1 | 4/1996 |
| DE | 19512799 | A1 | 10/1996 |
| DE | 19639035 | A1 | 4/1997 |
| DE | 19612516 | A1 | 5/1997 |
| DE | 19651108 | A1 | 10/1997 |
| DE | 19704996 | A1 | 10/1997 |
| DE | 19710884 | A1 | 10/1997 |
| DE | 19722441 | A1 | 12/1997 |
| EP | 59087828 | | 5/1984 |
| EP | 0450082 | A1 | 8/1990 |
| EP | 0559945 | A1 | 9/1993 |
| EP | 0581246 | A2 | 2/1994 |
| EP | 0649176 | A2 | 4/1995 |
| EP | 0668616 | A2 | 8/1995 |
| EP | 08186258 | | 7/1996 |
| EP | 0755076 | A2 | 1/1997 |
| EP | 0801425 | A1 | 10/1997 |
| EP | 0847090 | A2 | 6/1998 |
| GB | 2 268 332 | A | 1/1994 |
| JP | 405235345 | A * | 9/1993 |
| WO | 93/13559 | | 7/1993 |

OTHER PUBLICATIONS

*A Self–Aligned Trenched Cathode Lateral Insulated Gate Bipolar Transistor With High Latch–Up Resistence*, MOK, Philip K. T., et al., IEEE Transactions On Electron Devices, vol. 42, No. 12, Dec. 1995, pp. 2236–2239.

*600V Trench IGBT In Comparison With Planar IGBT*, Harada, M., et al., Proceedings of the $6^{th}$ International Symposium of Power Semiconductor Devices and IC's Davos, Switzerland, May 31,–Jun. 2, 1994, pp. 411–416.

*A 4500 V Injection Enhanced Insulated Gate Bipolar Transistor )IEGT) Operting In A Mode Similar To A Thyristor*, Kitagawa, Mitsuhiko, et al., IEDM 93, 1993, pp. 679–982.

*A Single Critical Mask Process For Manufacturing Very Large Area MOS–Controlled Power Transistors* Tsang, Dah Wen, EPE Journal, vol. 2, No. 2, Jun. 1992, pp. 95–100.

*The Complementary Insulated–Gate Bipolar Transistor (CIGBT)–A New Power Switching Device*, Boisvert, D. M., Plummer, James D., IEEE Electron Device Letters, vol. 11, No. 9, Sep. 1990, pp. 368–370.

*An Ultra–Low On–Resistance Power MOSFET Fabricated By Using A Fully Self Aligned Process*, Ueda, Daisuke, et al., IEEE Transactions On Electron Devices, vol. ED–34, No. 4, Apr. 1987, pp. 926–930.

*Insulated Gate Bipolar Transistor (IGBT) With A Trench Gate Structure*, Chang, H. R., et al., IEDM 87, 1987, pp. 674–677.

Hung Chang Lin. Youri F. Arzoumanian, Jack L. Halsor, Michael N. Giuliano, and Harry F. Benz, "Effect of Silicon–Gate Resistance on the Frequency Response of MOS Transistors", IEEE Transactions on Electron Devices, vol. ED–22, No. 5, May 1975, pp. 255–264.

Krishna C. Saraswat, and Farrokh Mohammadi, "Effect of Scaling of Interconnections on the Time Delay of VLSI Circuits", IEEE Transactions on Electron Devices, vol. ED–29, No. 4, Apr. 1982, pp. 645–650.

Akio Nakagawa, Yoshihiro Yamaguchi, Kiminori Watanabe, Hiromichi Ohashi, Masaru Shimbo, 1800V Non–Latch–Up Bipolar–Mode MOSFETs(IGBT) Fabricated by Silicon Wafer Direct Bonding, Toshiba Research & Development Center, Extended Abstracts of the $18^{th}$ (1986 International) Conference on Solid State Devices and Material, Tokyo, 1986, pp. 89–92.

Adrian Cogan, Nadim Maluf, and Richard Blanchard, Very Large–Area, High–Power, High–Voltage DMOS Transistor, 1987 Proc. of the $37^{th}$ Electronic Components Conference, Boston U.S.A., May 11–13, 1982, pp. 465–467.

Erik Jansen, "Spread of MOSpower Devices Motivates Drive To Improve Packing Technology", Electronic Engineering Times, Apr. 14, 1986, pp. 1–2.

Elektronik Schwerpunkt, Dietmar Vogel, "IGBT—hochsperrende, schnell schaltende Transistormodule", 9/30.4. 1987, pp. 120–124.

Bill Travis, "Power MOSFETs & IGBTs", EDN, Jan. 5, 1989, pp. 128–142.

* cited by examiner

BIPOLAR TRANSISTOR WITH AN INSULATED GATE ELECTRODE

FIELD OF THE INVENTION

The invention is concerned with the field of semiconductor technology. It relates in particular to an IGBT (Insulated Gate Bipolar Transistor) according to the preamble of the first claim. Such an IGBT is disclosed for example in the published German Patent Application DE 196 12 516 A1.

BACKGROUND OF THE INVENTION

In IGBTs according to the prior art, the gate signal in IGBT chips with a minimum surface area of 0.2 cm² is initially distributed over the periphery of the chip with the aid of a gate runner (see DE 196 12 516 A1). Narrow strips (gate fingers) then carry the signal inside the chip (clearly evident in EP 0 755 076 A2). Both the gate runner and the gate fingers are composed of an Al metalization layer. It is also possible for the signal, proceeding from a gate pad arranged in a corner or centrally, to be distributed over the chip surface via gate fingers (see FIG. 1). The design rule that is usually used states that the spacing x of the gate fingers must fulfill the following condition.

$$x << \sqrt{\frac{\tau}{R \cdot c}}$$

R is the sheet resistance of the polysilicon which carries the signal from the gate finger to the physical gate, c is the MOS capacitance per area of the gate, and $\tau$ is the characteristic switching time of the IGBT, given by $\tau = R_{Gate} \cdot C_{tot}$. $R_{Gate}$ is the gate series resistance and $C_{tot}$ is the total MOS capacitance of the chip. Typical values are c=30 nF/cm², R=30 ohms and $\tau$=200 nsec. That results in x<<0.47 cm. If the above condition is fulfilled, then—independently of the gate series resistance—the voltage distribution in the gate at any time during the switching is even and hence the current density is homogeneous.

However, gate fingers require complex and expensive soldering metalization if cathodal soldering is necessary, and impose high requirements on the passivation. Passivation weaknesses lead to gate-emitter short circuits which are manifested as premature failures and can only be detected by complicated burn-in tests. Similar problems arise in the case of pressure contact-making.

SUMMARY OF THE INVENTION

The object of the invention is to specify an IGBT which can be produced in a simple manner yet can be turned on homogeneously.

The essence of the invention, then, is that the gate current in the IGBT-Chip is forwarded, proceeding from the gate terminal, directly via the polysilicon layers of the gate electrodes to the IGBT standard cells, without the use of gate fingers. The gate signal can be fed to the IGBT chip via a gate terminal (gate pad) arranged in a corner according to a first exemplary embodiment or via a central gate terminal in accordance with a second exemplary embodiment.

The invention thus marks a departure that is diametrically opposed to the prevailing view that above a certain chip size, homogeneous turn-on can only be achieved using gate fingers. Rather, the inventors recognized for the first time that the design rules applicable to the homogeneous turn-off of an IGBT differ from those applicable to MOS transistors. The inventors have recognized, in particular, that the maximum dissipated power density is always homogeneous if the plasma distribution is still homogeneous. Particularly at the instant when the MOS current is no longer enough to maintain the external current, a bipolar component has a fundamentally different behavior than a unipolar element such as e.g. a MOS transistor. Said instant is followed by a transition from bipolar current to pure hole current, associated with depletion of the main junction. As soon as this process has concluded, the entire current is carried by holes and the space charge zone is built up. However, the plasma distribution is still very homogeneous laterally. Therefore, the highly inhomogeneous current distribution is also quickly homogenized. At the instant of the maximum power loss, the current distribution is virtually homogeneous. Therefore, the safe operating area is not reduced and the turn-off energy is hardly changed. As a consequence, IGBTs can be constructed without gate fingers, even when a minimum area of 0.2 cm² that is applicable to gate-fingerless MOS transistors is exceeded.

FIGS. 2a and 2b show an exemplary embodiment of an IGBT chip 1, according to the invention. The illustration shows a first main terminal 3 surrounded by insulation 7 and a gate frame 8. The gate frame 8 is connected to a gate terminal 4, from which e.g. bonding wires may lead to the corresponding housing terminal. In contrast to this, gate fingers 6 are provided in the case of the prior art according to FIGS. 1a and 1b, said gate fingers distributing the gate signal over the chip surface, proceeding from the gate terminal 4.

The advantages of the invention can be seen, in particular, in the fact that
- the obviation of the gate fingers enables simple and inexpensive implementation of the soldering metalization,
- the simpler technology enables a higher reliability in the pressure contact-making of the chips.

BRIEF DESCRIPTION OF THE DRAWINGS

The invention is explained in more detail below with reference to drawings in which:

FIG. 1b: shows a perspective illustration of part of the IGBT-Chip as shown in FIG. 1a;

FIG. 2b: shows a perspective illustration of part of the IGBT-Chip as shown in FIG. 2a;

The reference symbols used in the figures are summarized in the List of Designations.

DETAILED DESCRIPTION OF THE INVENTION

In preliminary experiments, a slow 2.5 kV chip with a minimum chip surface area of 0.2 cm² was constructed without gate fingers and its properties were measured.

Within the error limit, they were indistinguishable from the version with gate fingers. It was feared, however, that without gate fingers a fast chip would turn off under extremely inhomogeneous current distributions and therefore have high switching losses, slow transients and a small SOA. Analytical calculations, numerical simulations of the switching behavior and switching experiments of fast IGBTs without gate fingers showed surprising results, however. It was found that a signal propagation time comparable with the switching time τ does not necessarily lead to an inhomogeneous current distribution during turn-off. The experiments also showed that turn-on is non-critical in comparison with turn-off.

This is because if the gate driving takes place from the chip periphery and if $$x \approx \sqrt{\frac{\tau}{R \cdot c}}$$

is chosen, current redistribution occurs first of all during turn-off. The outer parts of the chip start to turn off and the load keeps the total current constant and commutates current into the centre of the chip. The. anode voltage is still essentially zero at that point in time.

At this point in time the MOS current is no longer enough to maintain the external current. In a straightforward MOS transistor, the voltage rise now commences. The voltage rise couples charge into the gate via the gate-anode (Miller) capacitance, in such a way that the voltage distribution over the gate remains constant and the current does not fall any further. As soon as the full load voltage is reached, the control mechanism terminates, the gate voltage decreases and the component turns off.

The essence of the invention, then, is the recognition and advantageous exploitation of the fact that a bipolar component behaves fundamentally differently from the abovementioned point in time. Said point in time is followed by a transition from bipolar current to pure hole current, associated with depletion of the main junction. As soon as this process is concluded, the entire current is carried by holes and the space charge zone builds up. However, the plasma distribution is still very homogeneous laterally. Therefore, the highly inhomogeneous current distribution at said point in time is also quickly homogenized. At the instant of maximum power loss, the current distribution is virtually homogeneous. Therefore, the safe operating area is not reduced and the turn-off energy is hardly changed. It is thus possible to construct IGBTs which manage without gate fingers.

Figure 1A:
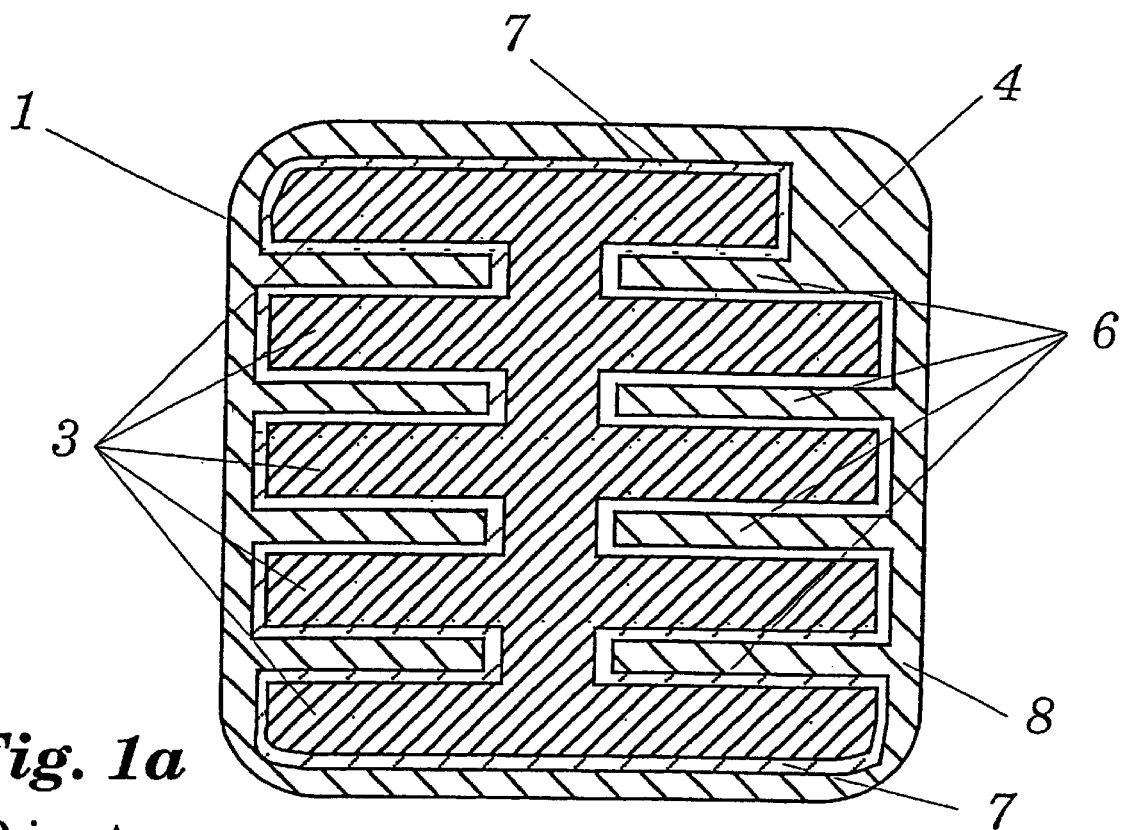
FIG. 1a: shows a plan view of an IGBT-Chip according to the prior art.
Figure 2A:
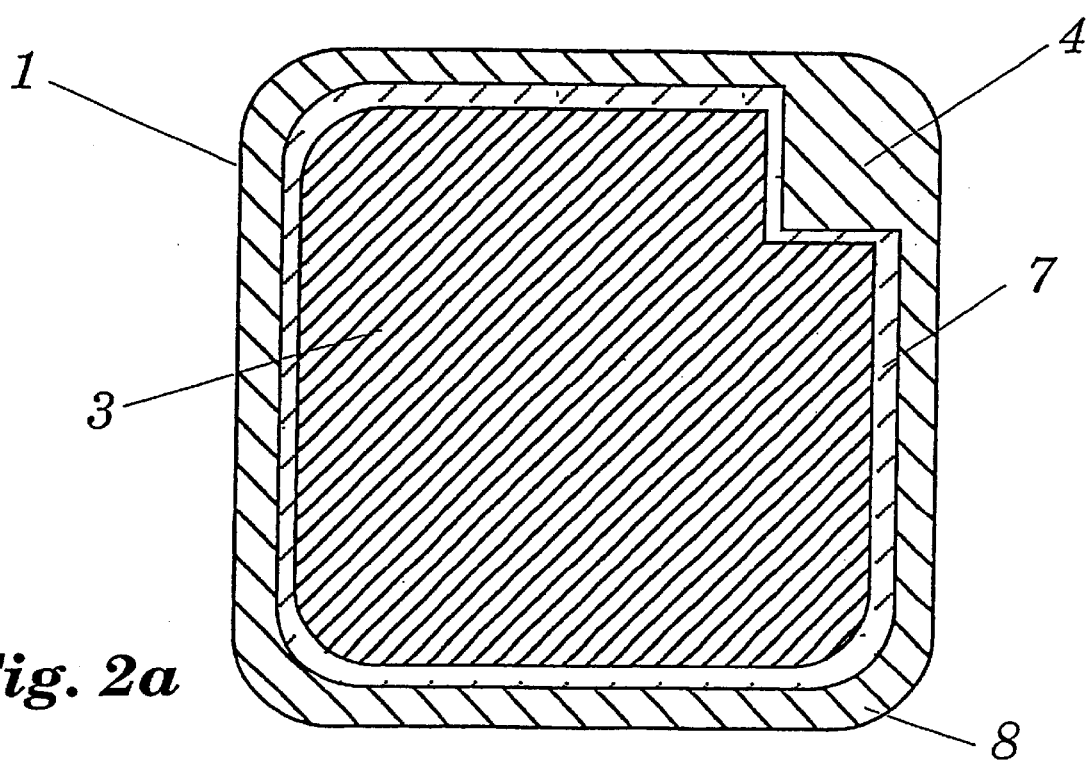
FIG. 2a: shows a plan view of an IGBT-Chip according to the invention, according to a first exemplary embodiment.
Figure 1B:
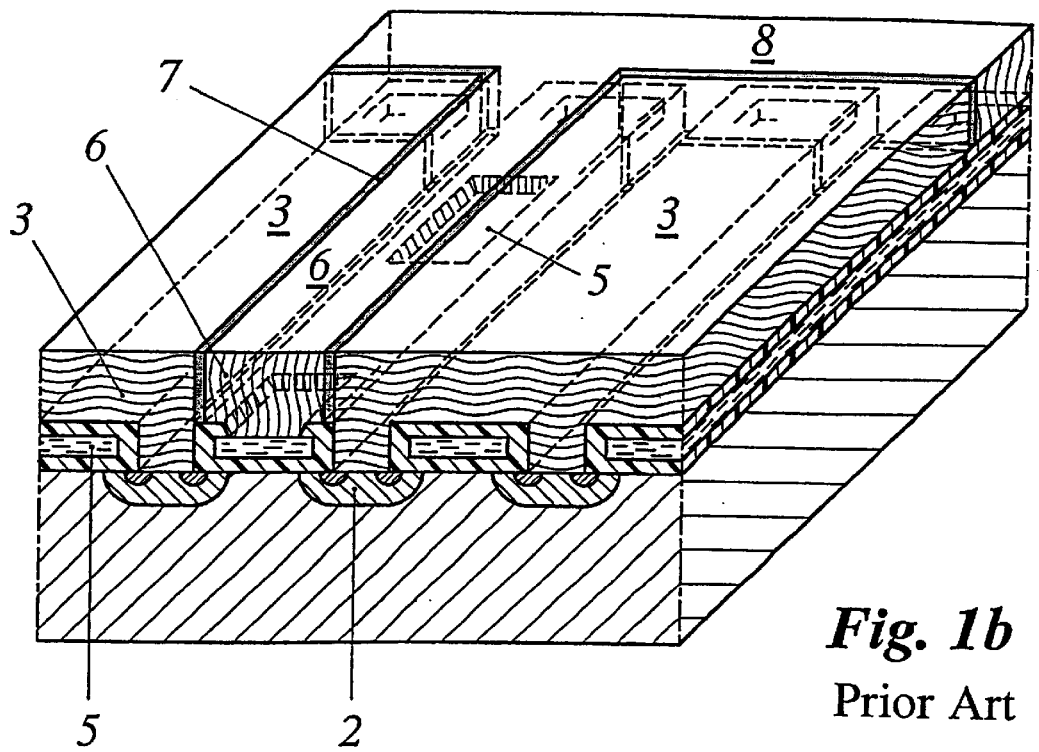
Figure 2B:
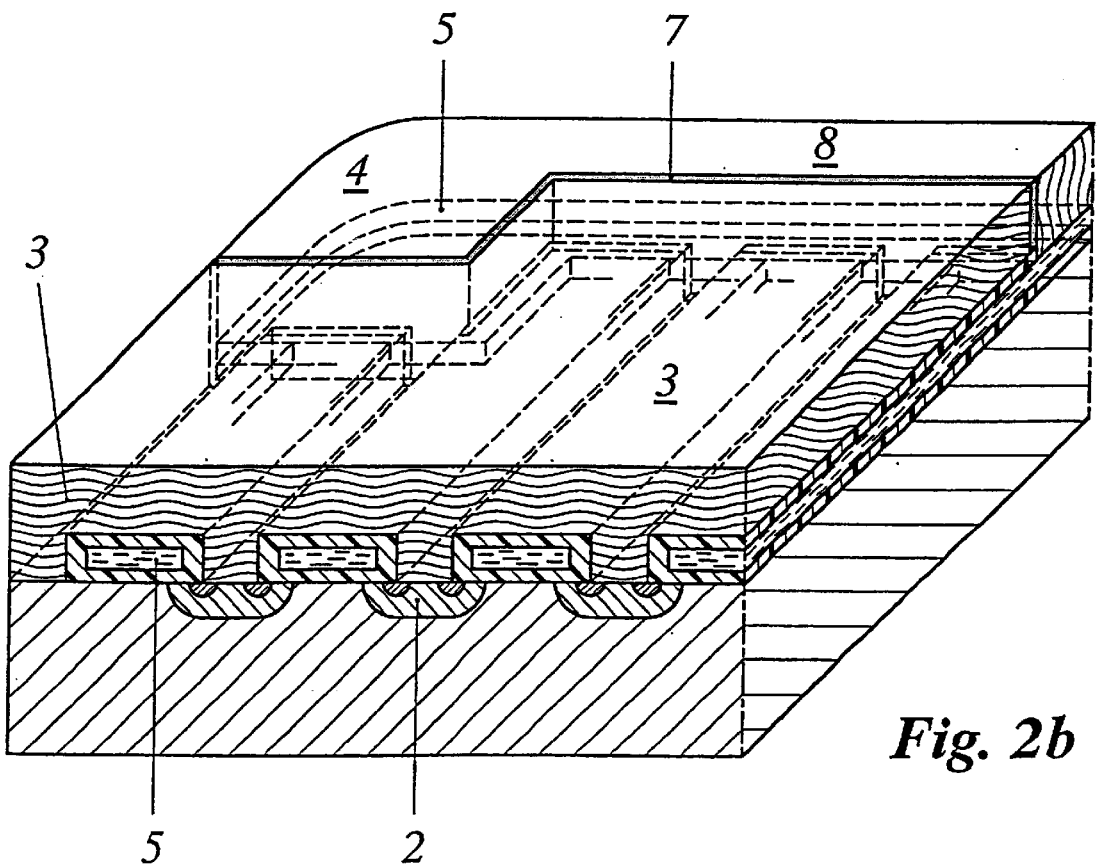

FIGS. 2a and 2b show a gate-fingerless IGBT chip 1 according to the invention from above and, respectively, in a perspective illustration with a first main terminal (visible) and a second main terminal (not illustrated) and also a gate terminal 4, which is arranged at the edge, in particular in a corner of the IGBT chip 1, in the embodiment illustrated in FIGS. 2a and 2b. In contrast to FIGS. 1a and 1b, which illustrate the prior art, no gate fingers 6 are provided, rather the gate signal is distributed over the periphery, proceeding from the gate terminal 4, via a gate frame 8. As can be seen in FIG. 2b, the gate frame 8 is also directly operatively connected to the gate electrodes 5. It preferably has a resistance of less than 5 ohms.

The first main terminal 3 is thus formed by an area which is convex except for a cutout for the gate terminal 4, its convexly designed areal region being surrounded by the gate frame 8 in the case of the embodiment as shown in FIGS. 2a and 2b. If there are a plurality of gate terminals 4, then the essentially convex area of the first main terminal has a corresponding number of cutouts.

Figure 4:
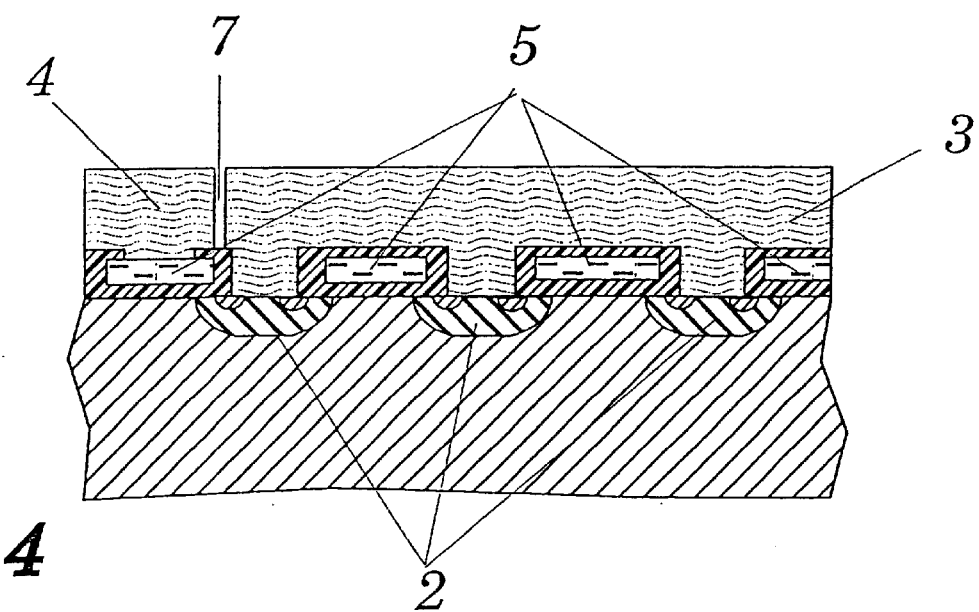
FIG. 4: shows a section through an IGBT-Chip according to the invention.
Figure 5:
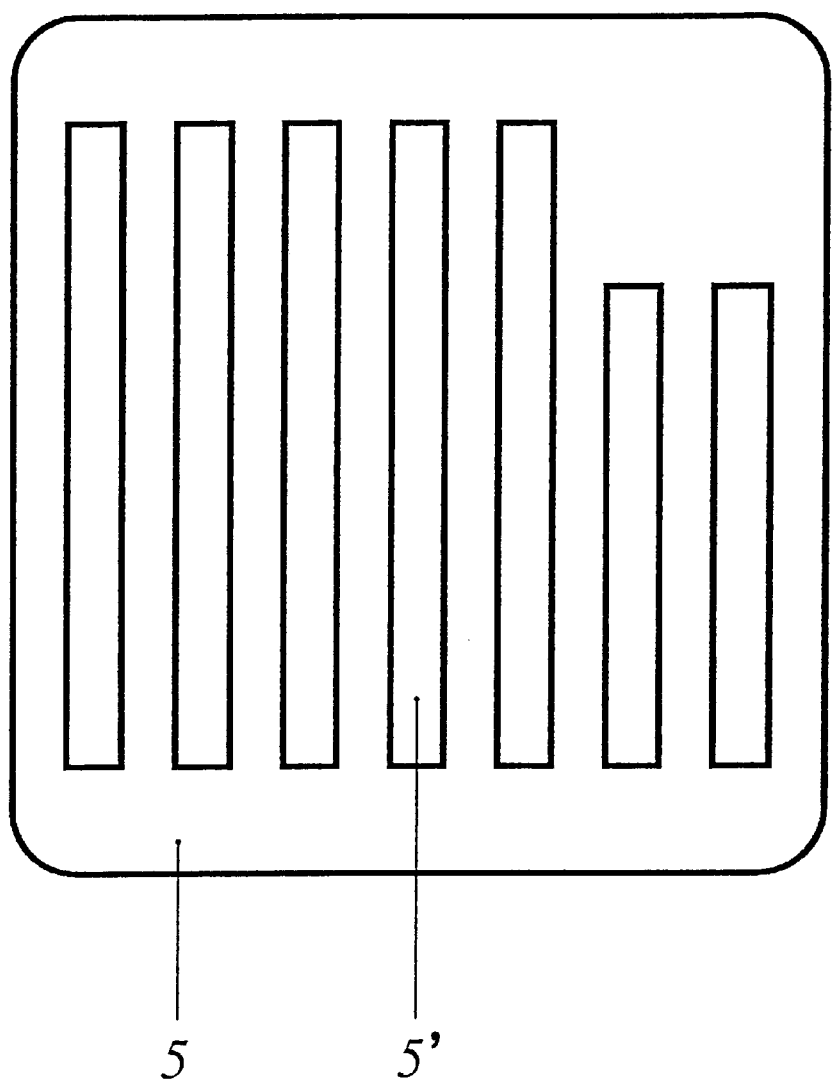
FIG. 5: shows a plan view of a polysilicon layer.

Insulation 7 is provided between the large-area first main terminal (illustrated as a metalization layer), which is formed in particular by the cathode of the IGBT, and the gate terminal 4 and the gate frame 8. According to the invention, the gate terminal 4 or the gate frame 8 is connected to the polysilicon layers of the gate electrodes 5 of the IGBT directly, i.e. without the interposition of gate fingers. FIG. 4 shows this in section. The polysilicon layer 5 of the IGBT is connected directly to the gate terminal 4. The remaining polysilicon layers 5 of the IGBT standard cells 2 are connected in parallel in the component. An embodiment of an arrangement of the polysilicon layers 5 is illustrated in FIG. 5. It covers the chip in a large-area manner in this case and has cutouts 5'. FIG. 4 also clearly shows the insulation 7, provided between the gate terminal 4 and the first main terminal 3, or the trench provided therefor.

Figure 3:
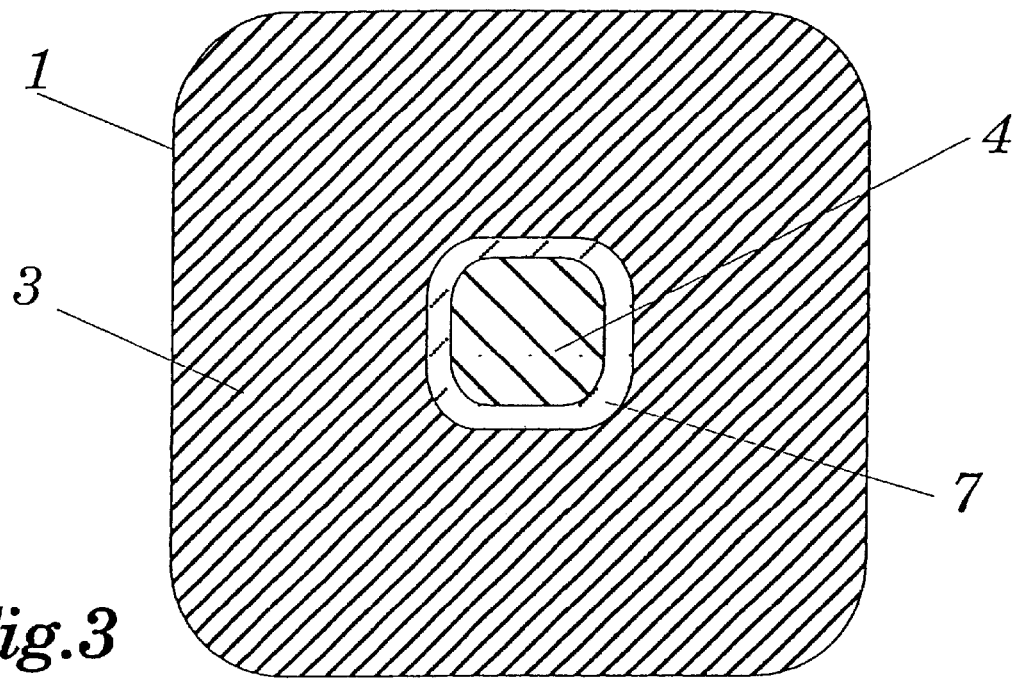
FIG. 3: shows a plan view of an IGBT-Chip according to the invention, according to a second exemplary embodiment.

It goes without saying that the gate terminal 4 can also be arranged centrally on the IGBT-Chip 1. FIG. 3 shows this embodiment. The gate terminal 4 is again surrounded by insulation 7 which decouples it from the main terminal 3.

LIST OF REFERENCE SYMBOLS

1 IGBT-chip
2 IGBT standard cell
3 First main terminal
4 Gate terminal (gate pad)
5 Gate electrode
5' Cutout
6 Gate finger
7 Insulation
8 Gate frame

What is claimed is:

1. An insulated gate bipolar transistor (IGBT) comprising:
   at least one IGBT-Chip with a plurality of parallel-connected IGBT standard cells for each at least one IGBT-Chip;
   a first main terminal;
   a second main terminal; and
   at least one gate terminal;
   wherein the at least one gate terminal is directly electrically operatively connected to gate electrodes of the IGBT standard cells, the gate electrodes being formed by polysilicon layers electrically connected in parallel,
   wherein the maximal gate signal propagation distance from the at least one gate terminal within the polysilicon layers is at least approximately equal to $\sqrt{\tau/R \cdot c}$ with R being the sheet resistance of the polysilicon layers, c being the metal oxide semiconductor (MOS) capacitance per area of the gate, and $\tau = R_{Gate} \cdot C_{tot}$ being the characteristic switching time of the at least one IGBT-Chip, with $R_{Gate}$ being the gate series resistance and $C_{tot}$ being the total MOS capacitance of the at least one IGBT-Chip.

2. The insulated gate bipolar transistor (IGBT) of claim 1, wherein the at least one IGBT-Chip has an area of at least 0.2 cm².

3. The bipolar transistor as claimed in claim 1, wherein the first main terminal is formed by an area which is convex except for at most one cutout for each of the at least one gate terminal.

4. The insulated gate bipolar transistor as claimed in claim 1, wherein the at least one gate terminal is arranged at an edge of the at least one IGBT chip.

5. The bipolar transistor as claimed in claim 4, further comprising:
   a metalized gate frame surrounding the at least one IGBT chip, said frame being electrically connected to the at least one gate terminal;
   and insulation provided between the first main terminal, and the gate frame or the at least one gate terminal, wherein the insulation is arranged on the same side of the at least one IGBT chip as the at least one gate terminal.

6. The bipolar transistor as claimed in claim 5, wherein the gate frame has a sheet resistance of less than 5 ohms.

7. The bipolar transistor as claimed in claim 3, wherein the gate frame surrounds the convexly designed areal region of the first main terminal.

8. The bipolar transistor as claimed in claim 1, wherein the at least one gate terminal is arranged essentially in the center of the IGBT chip and is surrounded by insulation.

9. The insulated gate bipolar transistor as claimed in claim 4, wherein the gate terminal is arranged on a corner of the at least one IGBT chip.

10. The IGBT of claim 1, wherein the maximal gate signal propagation distance from the at least one gate terminal within the polysilicon layers is about $$\sqrt{\frac{\tau}{R \cdot c}}.$$

* * * * *